(12) United States Patent
Cheng et al.

(10) Patent No.: US 8,642,417 B2
(45) Date of Patent: Feb. 4, 2014

(54) METHOD OF MANUFACTURING STRAINED SOURCE/DRAIN STRUCTURES

(71) Applicant: Taiwan Semiconductor Manufacturing Company, Ltd., Hsinchu (TW)

(72) Inventors: Chun-Fai Cheng, Tin Shui Wai (HK); Li-Ping Huang, Taipei (TW); Ka-Hing Fung, Hsinchu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 0 days.

(21) Appl. No.: 13/920,703

(22) Filed: Jun. 18, 2013

(65) Prior Publication Data

US 2013/0280875 A1 Oct. 24, 2013

Related U.S. Application Data

(62) Division of application No. 13/161,031, filed on Jun. 15, 2011, now Pat. No. 8,482,079.

(51) Int. Cl.
*H01L 21/8238* (2006.01)
(52) U.S. Cl.
USPC .................. 438/199; 438/300; 257/21.632 E; 257/E21.619

(58) Field of Classification Search
USPC .................. 438/197, 198, 199, 300, 303; 257/E21.632, E21.619
See application file for complete search history.

(56) References Cited

U.S. PATENT DOCUMENTS

| | | | |
|---|---|---|---|
| 6,946,350 B2 | 9/2005 | Lindert et al. | |
| 7,335,959 B2 | 2/2008 | Curello et al. | |
| 7,494,858 B2 | 2/2009 | Bohr et al. | |
| 2012/0261718 A1* | 10/2012 | Sosa Cortes et al. | 257/192 |
| 2012/0280251 A1 | 11/2012 | Dube et al. | |

* cited by examiner

*Primary Examiner* — Hoai V Pham
(74) *Attorney, Agent, or Firm* — Lowe Hauptman & Ham, LLP

(57) ABSTRACT

A method includes forming a gate structure over a semiconductor substrate. The gate structure defines a channel region in the semiconductor substrate. Trenches are formed in the semiconductor substrate, and the trenches are interposed by the channel region. A first semiconductor layer is epitaxially grown in the trenches, and the first semiconductor layer has a first dopant with a first dopant concentration. A second semiconductor layer is epitaxially grown over the first semiconductor layer, and the second semiconductor layer has a second dopant with a second dopant concentration. The second dopant has an electrical carrier type opposite to an electrical carrier type of the first dopant.

20 Claims, 9 Drawing Sheets

US 8,642,417 B2

METHOD OF MANUFACTURING STRAINED SOURCE/DRAIN STRUCTURES

PRIORITY CLAIM

The present application is a divisional of U.S. application Ser. No. 13/161,031, filed Jun. 14, 2011, the disclosure of which is incorporated herein by reference in its entirety.

RELATED APPLICATIONS

The present disclosure is related to the following commonly-assigned U.S. patent application, the entire disclosure of which is incorporated herein by reference: U.S. application Ser. No. 13/026,519 for "METHOD OF MANUFACTURING STRAINED SOURCE/DRAIN STRUCTURES".

TECHNICAL FIELD

The present disclosure relates to integrated circuit devices and methods for manufacturing integrated circuit devices.

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC manufacturing are needed. For example, as semiconductor devices, such as metal-oxide-semiconductor field-effect transistors (MOSFETs), are scaled down through various technology nodes, strained source/drain features (e.g., stressor regions) have been implemented using epitaxial (epi) semiconductor materials to enhance carrier mobility and improve device performance. Forming a MOSFET with stressor regions often includes using epitaxially grown silicon (Si) to form raised source and drain features for an n-type device, and epitaxially growing silicon germanium (SiGe) to form raised source and drain features for a p-type device. However, approaches known to the Applicants have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
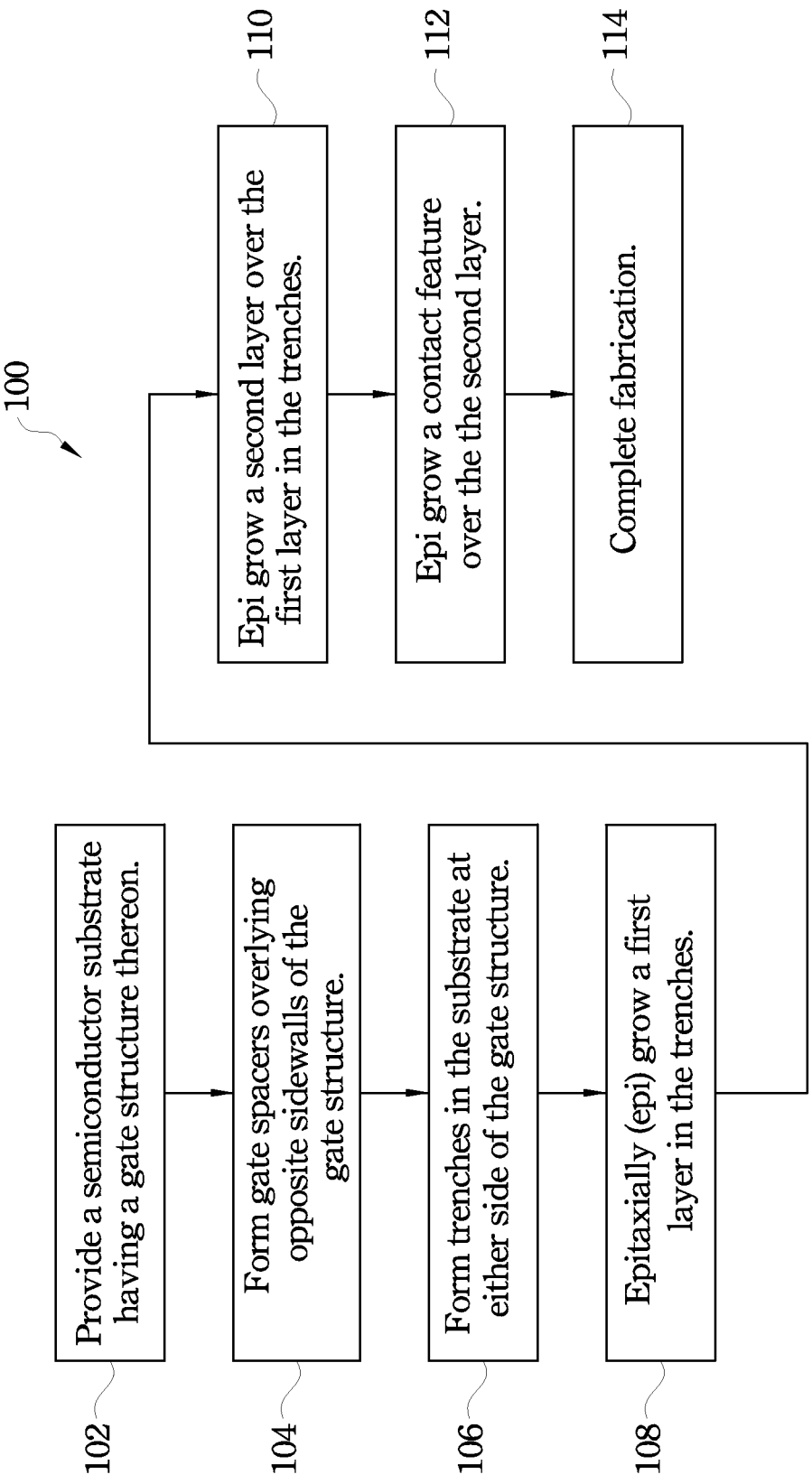
FIG. 1 is a flow chart of a method of fabricating an integrated circuit device according to an embodiment of the present disclosure.

It is understood that the following disclosure provides many different embodiments, or examples, for implementing different features of the present application. Specific examples of components and arrangements are described below to facilitate the illustrations presented in the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

With reference to FIGS. 1 and 2-7, a method 100 and a semiconductor device 200 are collectively described below. The semiconductor device 200 depicted in FIGS. 2-7 is an integrated circuit, or a portion thereof, that can comprise memory cells and/or logic circuits. The semiconductor device 200 can include passive components such as resistors, capacitors, inductors, and/or fuses; active components, such as P-channel field effect transistors (PFETs), N-channel field effect transistors (NFETs), metal-oxide-semiconductor field effect transistors (MOSFETs), complementary metal-oxide-semiconductor transistors (CMOSs), high voltage transistors, and/or high frequency transistors; other suitable components; and/or combinations thereof. It is understood that additional steps can be provided before, during, and/or after the method 100, and some of the steps described below can be replaced or eliminated, in some embodiments of the method. It is further understood that in some embodiments additional features can be added in the semiconductor device 200, and in some other embodiments some of the features described below can be replaced or eliminated.

Figure 2:
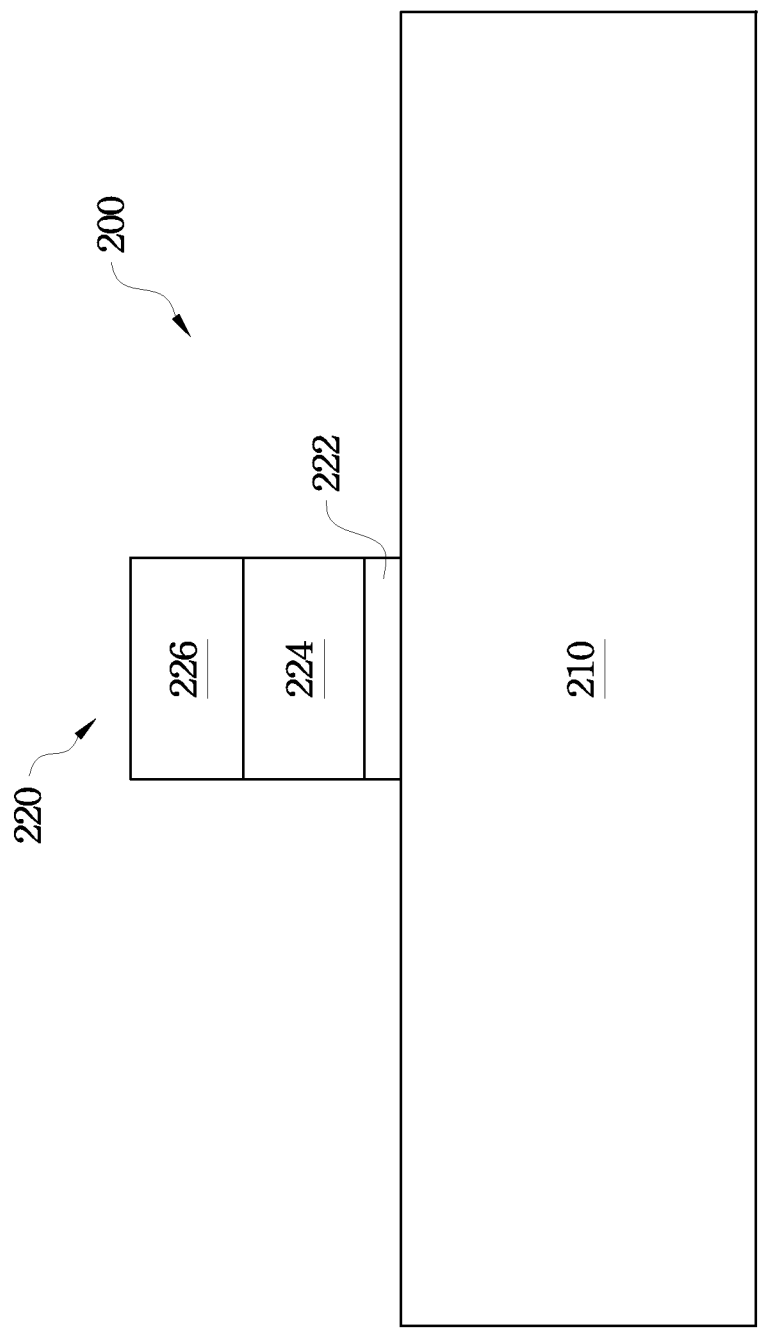
FIGS. 2-7 are various diagrammatic cross-sectional views of an example integrated circuit device at various fabrication stages according to the method of FIG. 1.

Referring to FIGS. 1 and 2, the method 100 begins at step 102, wherein a substrate 210 is provided. In the present embodiment, the substrate 210 is a semiconductor substrate comprising silicon. The silicon substrate, for example, is a so-called (001) substrate having a top surface parallel with a (001) lattice plane. In some alternative embodiments, the substrate 210 comprises an elementary semiconductor including silicon and/or germanium in crystal; a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. The alloy semiconductor substrate may have a gradient SiGe feature in which the Si and Ge composition change from one ratio at one location to another ratio at another location of the gradient SiGe feature. The alloy SiGe may be formed over a silicon substrate. The SiGe substrate may be strained. Furthermore, the semiconductor substrate may be a semiconductor on insulator (SOI). In some examples, the semiconductor substrate may include a doped epi layer. In other examples, the silicon substrate may include a multilayer compound semiconductor structure.

The substrate 210 may include various doped regions depending on design requirements (e.g., p-type wells or n-type wells). The doped regions may be doped with p-type dopants, such as boron or $BF_2$; n-type dopants, such as phosphorus or arsenic; or a combination thereof. The doped regions may be formed directly in the substrate 210, in a P-well structure, in an N-well structure, in a dual-well structure, or using a raised structure. The semiconductor device 200 may include a PFET device and/or a NFET device, and thus, the substrate 210 may include various doped regions configured for the PFET device and/or the NFET device. A gate structure 220 for the PFET device and/or the NFET device is formed over the substrate 210. The gate structure 220, for example, is formed on the substrate 210 in the <110> direction when the substrate 210 is a so-called (001) substrate. In some embodiments, the gate structure 220 includes, in order, a gate dielectric 222, a gate electrode 224, and a hard mask 226. The gate structure 220 may be formed by deposition, lithography patterning, and/or etching processes known to the Applicants.

The gate dielectric 222 is formed over the substrate 210 and includes a dielectric material, such as silicon oxide, silicon oxynitride, silicon nitride, a high dielectric constant (high-k) dielectric material, other suitable dielectric material, or combinations thereof. Exemplary high-k dielectric materials include $HfO_2$, HfSiO, HfSiON, HfTaO, HfSiO, HfZrO, other suitable materials, or combinations thereof. In some embodiments, the gate dielectric 222 may be a multilayer structure, for example, including an interfacial layer, and a high-k dielectric material layer formed on the interfacial layer. An exemplary interfacial layer may be a grown silicon oxide layer formed by a thermal process or atomic layer deposition (ALD) process.

The gate electrode 224 is formed over the gate dielectric 222. In some embodiments, the gate electrode 224 is formed by a polycrystalline silicon (polysilicon) layer. The polysilicon layer may be doped for proper conductivity. In some alternative embodiments, the polysilicon is not necessarily doped if a dummy gate is to be formed and replaced in a subsequent gate replacement process. In yet some alternative embodiments, the gate electrode 224 could include a conductive layer having a proper work function. Therefore, the gate electrode 224 can also be referred to as a work function layer. The work function layer may comprise any suitable material, such that the layer can be tuned to have a proper work function for enhanced performance of the associated device. For example, in some embodiments, a p-type work function metal (p-metal) for the PFET device comprises TiN or TaN. On the other hand, in some embodiments, an n-type work function metal (n-metal) for the NFET device comprises Ta, TiAl, TiAlN, or TaCN. The work function layer may include doped conducting oxide materials. The gate electrode 224 may include other conductive materials, such as aluminum, copper, tungsten, metal alloys, metal silicide, other suitable materials, or combinations thereof. For example, where the gate electrode 224 includes a work function layer, another conductive layer can be formed over the work function layer.

The hard mask 226 formed over the gate electrode 224 includes silicon oxide, silicon nitride, silicon oxynitride, silicon carbide, other suitable dielectric material, or combinations thereof. The hard mask 226 may have a multi-layer structure.

Figure 3:
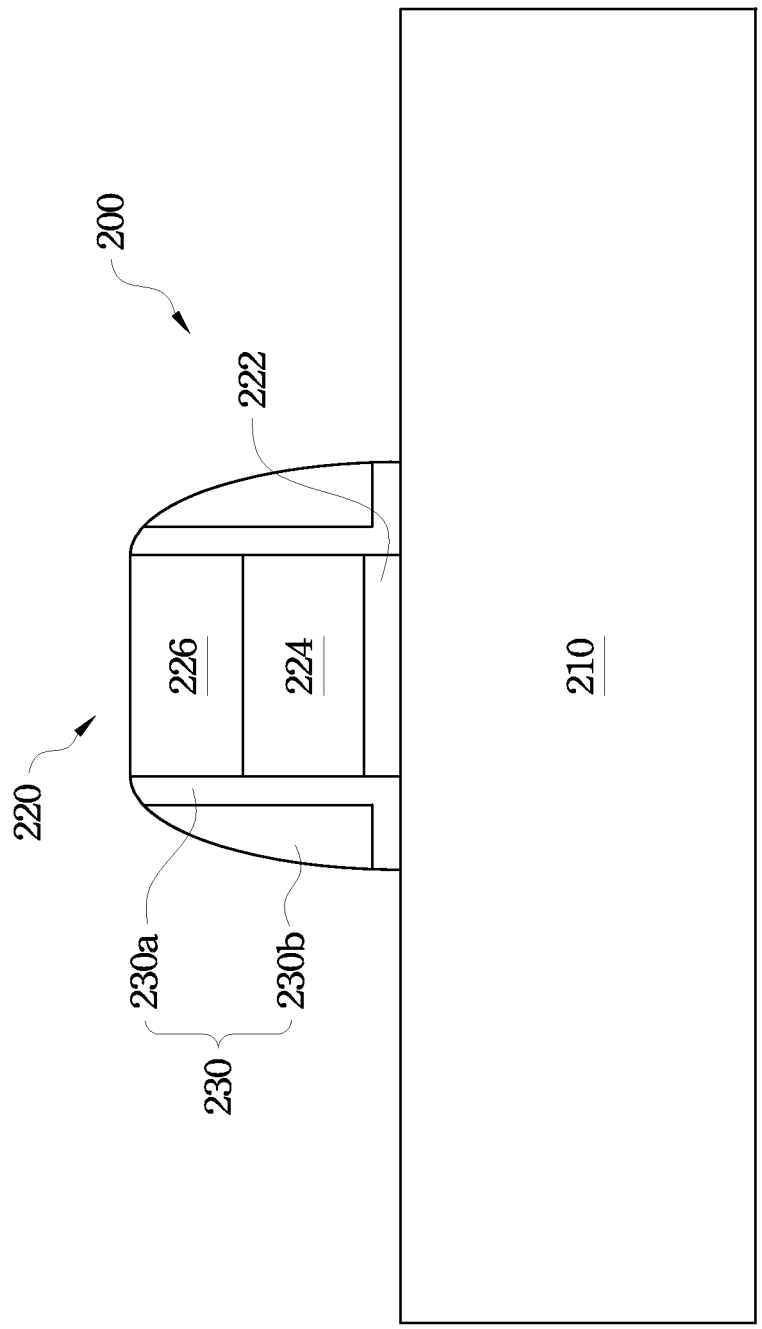

Referring to FIGS. 1 and 3, the method 100 continues with step 104 in which gate spacers 230 are formed adjoining opposite sidewalls of the gate structure 220. In the depicted embodiment, a first spacer material (not shown) is deposited over the gate structure 220 and the substrate 210. The first spacer material may be formed by plasma-enhanced chemical vapor deposition (PECVD) and/or other suitable processes. In at least one embodiment, the first spacer material is a dielectric layer comprising silicon oxide. In at least one embodiment, the first spacer material has a thickness of less than approximately 150 Angstroms. Thereafter, a second spacer material (not shown) is deposited over the first spacer material. The second spacer material may be deposited using physical vapor deposition (PVD) (sputtering), chemical vapor deposition (CVD), plasma-enhanced chemical vapor deposition (PECVD), atmospheric pressure chemical vapor deposition (APCVD), low-pressure CVD (LPCVD), high density plasma CVD (HDPCVD), atomic layer CVD (ALCVD), and/or other suitable processes. In at least one embodiment, the second spacer material is a dielectric layer comprising silicon nitride. Other exemplary compositions for the second spacer material include silicon oxide, silicon carbide, silicon oxynitride, combinations thereof, and/or other suitable materials. In at least one embodiment, the second spacer material has a thickness less than approximately 200 Angstroms.

After the formation of the first and second spacer materials over the gate structure 220, a patterning process, e.g., blanket dry etching process, is performed on the first and second spacer materials to form the gate spacers 230. The etching process may include an anisotropic etch to partially remove the first and second spacer materials from the substrate 210 in regions where epitaxy features or raised source/drain features will be formed. The gate spacers 230 may include first spacers (or may be referred to liners) 230a formed by the first spacer material and second spacers 230b formed by the second spacer material. The first spacers 230a are formed with an L-shape and the second spacers 230b are formed with a D-shape.

Figure 4:
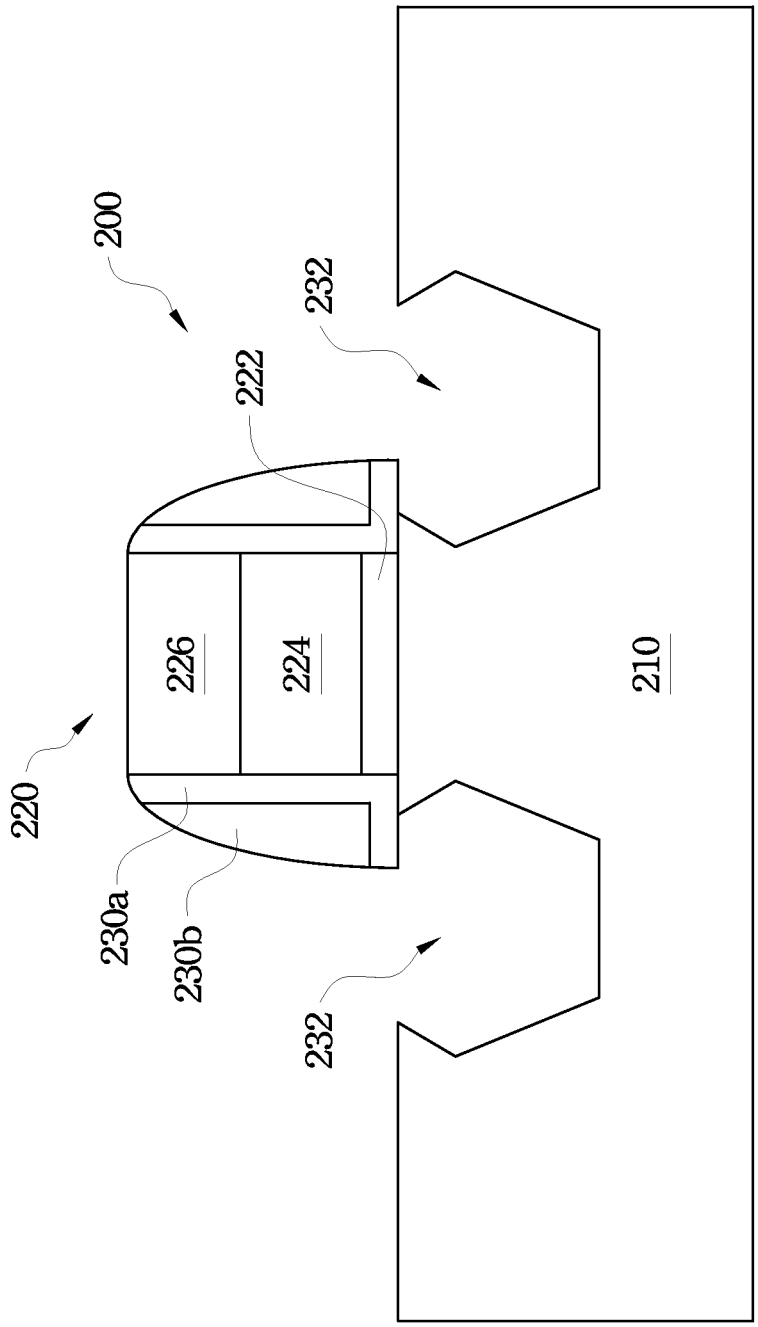

Referring to FIGS. 1 and 4, the method 100 continues with step 106 in which trenches 232 are formed in the substrate 210 at either side of the gate structure 220, particularly in the source and drain regions of the PFET device or the NFET device.

A capping layer (not shown) and a photoresist layer (not shown) may be formed over the semiconductor device 200 and then patterned to protect the other device region. The photoresist layer may further include an antireflective coating layer (not shown), such as a bottom antireflective coating (BARC) layer and/or a top antireflective coating (TARC) layer. An etching process then removes portions of the substrate 210 to form the trenches 232 in the substrate 210. The etching process includes a dry etching process, wet etching process, or combination thereof. In some embodiments, the etching process utilizes a combination of dry and wet etching processes. The dry and wet etching processes have etching parameters that can be tuned, such as etchants used, etching temperature, etching solution concentration, etching pressure, source power, RF bias voltage, RF bias power, etchant flow rate, and other suitable parameters. For example, the dry etching process may utilize an etching pressure of about 1 mTorr to about 200 mTorr, a source power of about 200 W to about 2000 W, an RF bias voltage of about 0 V to about 100 V, and an etchant that includes $NF_3$, $Cl_2$, $SF_6$, He, Ar, $CF_4$, or combinations thereof. In an example, the dry etching process includes an etching pressure of about 1 mTorr to about 200 mTorr, a source power of about 200 W to about 2000 W, an RF bias voltage of about 0 V to about 100 V, a $NF_3$ gas flow of about 5 sccm to about 30 sccm, a $Cl_2$ gas flow of about 0 sccm to about 100 sccm, an He gas flow of about 0 sccm to about 500 sccm, and an Ar gas flow of about 0 sccm to about 500 sccm. In another example, the etching process includes an etching pressure of about 1 mTorr to about 200 mTorr, a source power of about 200 W to about 2000 W, an RF bias voltage of about 0 V to about 100 V, a $SF_6$ gas flow of about 5 sccm to about 30 sccm, a $Cl_2$ gas flow of about 0 sccm to about 100 sccm, an He gas flow of about 0 sccm to about 500 sccm, and an Ar gas flow of about 0 sccm to about 500 sccm. In yet another example, the etching process includes an etching pressure of about 1 mTorr to about 200 mTorr, a source power of about 200 W to about 2000 W, an RF bias voltage of about 0 V to about 100 V, a $CF_4$ gas flow of about 5 sccm to about 100 sccm, a $Cl_2$ gas flow of about 0 sccm to about 100 sccm, an He gas flow of about 0 sccm to about 500 sccm, and an Ar gas flow of about 0 sccm to about 500 sccm. The wet etching solutions may include $NH_4OH$, hydrofluoric acid (HF), tetramethylammonium hydroxide (TMAH), other suitable wet etching solutions, or combinations thereof. In an example, the wet etching process first uses a 100:1 concentration of an HF solution at room temperature, and then uses a $NH_4OH$ solution at a temperature of about 20° C. to about 60° C. In another example, the wet etching process first uses a 100:1 concentration of an HF solution at room temperature, and then implements a TMAH solution at a temperature of about 20° C. to about 60° C. After the etching process, a pre-cleaning process may be performed to clean the trenches 232 with a hydrofluoric acid (HF) solution or other suitable solution.

Figure 4A:
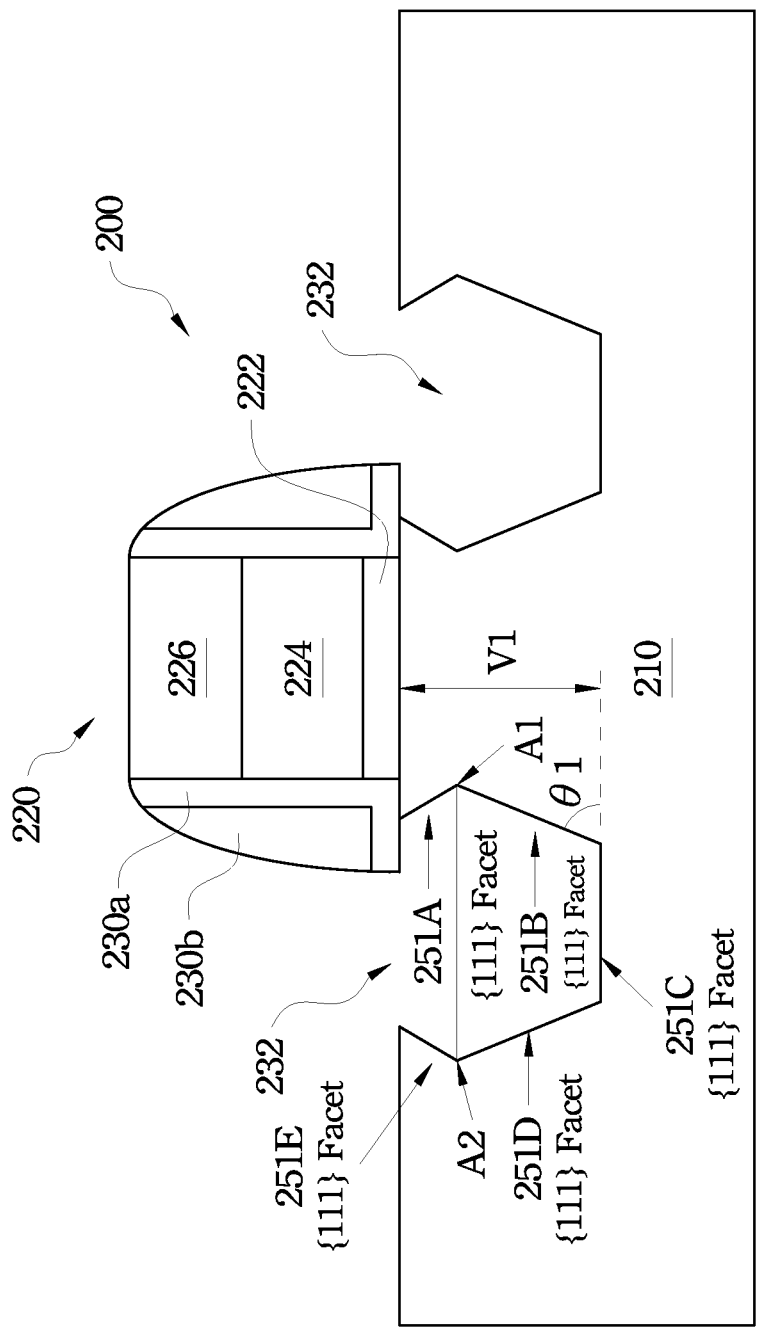

In FIG. 4A, the semiconductor device 200 is enlarged for better understanding of the etching profile of trenches 232. The etching profile of the trenches 232 defines pocket (halo) regions and/or source and drain regions of the NFET or PFET device, and the etching profile of the trenches 232 is defined by facets 251A, 251B, 251C, 251D, and 251E in the substrate 210. In some embodiments, the facets 251A, 251B, 251C, 251D, and 251E together define the trenches 232 with wedge-shaped. The facets 251A and 251E may be referred to as top sidewall facets, the facets 251B and 251D may be referred to as middle sidewall facets, and the facet 251C may be referred to as bottom facet. In the depicted embodiment, the facets 251A and 251E are formed of {111} crystallographic plane and slope to the principle surface of the substrate 210, the facets 251B and 251D are formed of {111} crystallographic plane and below the facets 251A and 251E, respectively. The facet 251C is formed of {100} crystallographic plane parallel to the principal surface of the substrate 210. In the depicted embodiment, the trenches 232 have a depth V1 ranging from about 300 Angstroms to about 1000 Angstroms from the top surface of substrate 210 to facet 251C.

In the depicted embodiment, the etching profile of the trenches 232 defines a tip A1 by the intersection point of the facets 251A and 251B and a tip A2 by the intersection of the facets 251D and 251E. The tip A1, for example, is positioned under the gate spacer 230 toward the channel region underneath the gate structure 220. The etching profile of the trenches 232 defines a wedge-shaped bottom by the facets 251B, 251C, and 251D. In some embodiments, the facet 251B forms an angle θ1 to the principal surface of the substrate 210. The angle θ1, for example, is ranging from about 40 degrees to about 70 degrees with respect to the principle surface of substrate 210.

Figure 5:
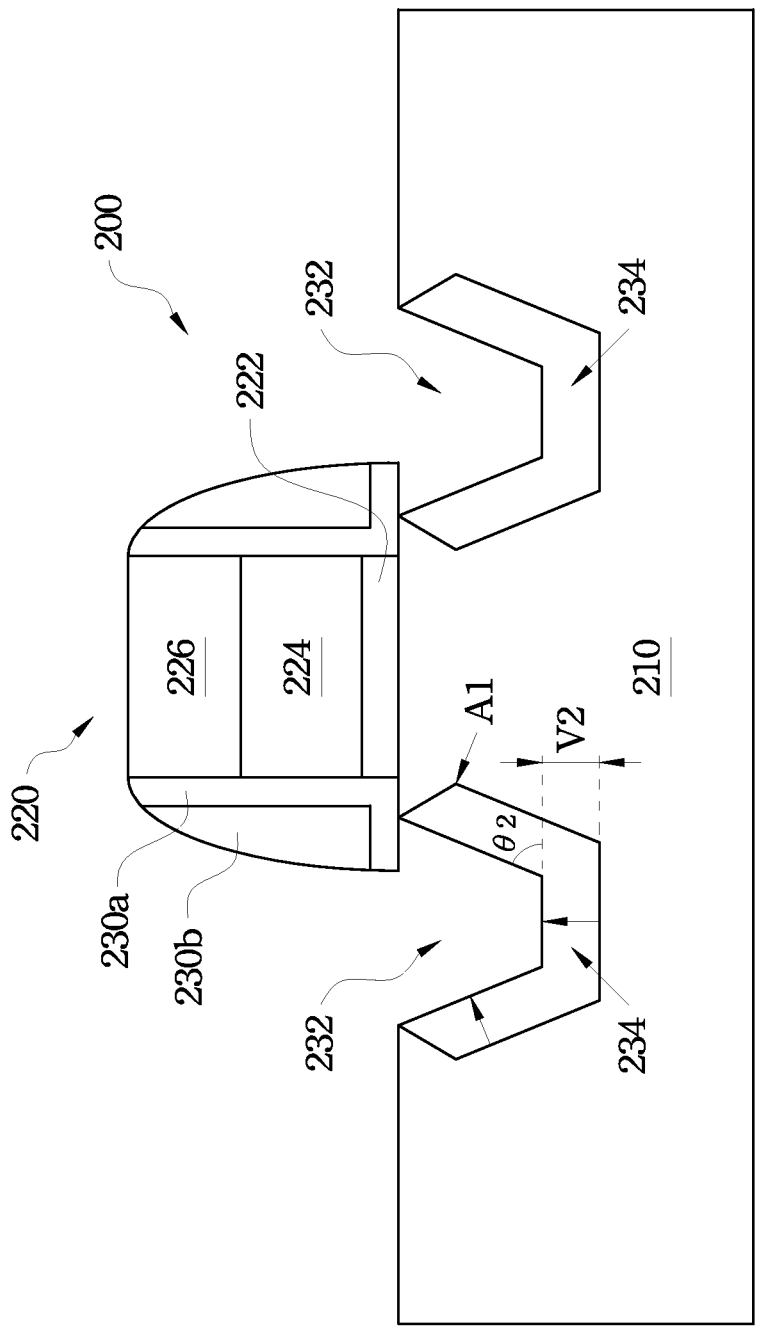

Referring to FIGS. 1 and 5, the method 100 continues with step 108 in which a first layer 234 is formed in the trenches 232. In some embodiments, the first layer 234 is an epitaxial layer formed by an epitaxy or epitaxial (epi) process. The epitaxial layer is growth on the facets 251A, 251B, 251C, 251D, and 251E such that the crystal structures in the epitaxial layer are the same as the facets 251A, 251B, 251C, 251D, and 251E. In some embodiments, the first layer 234 contacts the substrate 210 and with a wedge-shape by being formed along the bottom portion of the trenches 232. In some embodiments, a top surface of the bottom portion of the first layer 234 is substantially parallel to the principal surface of the substrate 210. In some embodiments, a sidewall surface of the first layer 234 near the facet 251B forms an angle θ2 with respect to the principal surface of the substrate 210. In one embodiment, the angle θ2 is ranging from about 40 degrees to about 70 degrees with respect to the principle surface of substrate 210. In another embodiment, a ratio of the angle θ2 to the angle θ1 is ranging from about 0.7 to about 1.5. In other embodiment, the angle θ2 and the angle θ1 are substantially the same. The first layer 234 has a thickness V2. In some embodiments, the thickness V2 is ranging from about 100 Angstroms to about 400 Angstroms. In the depicted embodiment, the first layer 234 partially fill the trenches 232 by an epitaxy or epitaxial (epi) process, including selective epitaxy growth (SEG) process, cyclic deposition and etching (CDE) process, chemical vapor deposition (CVD) techniques (e.g., vapor-phase epitaxy (VPE) and/or ultra-high vacuum CVD (UHV-CVD)), molecular beam epitaxy (MBE), other suitable epi processes, or combination thereof. The epi process may use gaseous and/or liquid precursors, which may interact with the composition of the substrate 210.

In one embodiment, the first layer 234 is a halo (pocket) layer for surrounding subsequently formed source/drain (S/D) features to improve short channel effect. The first layer 234, for example, is a silicon-containing layer comprising a first dopant with a first dopant concentration. In some embodiments, the first dopant has a first electrical carrier type. In at least one embodiment, the first dopant is a p-type dopant (such as boron and/or $BF_2$) for NFET devices. In other embodiment, the first dopant is an n-type dopant (such as phosphorous and/or arsenic) for PFET devices. In some embodiments, the first layer 234 is in-situ doped during the epi process for forming the first layer 234. In embodiments, the first dopant concentration is ranging from about 1E18 atoms/$cm^3$ to about 5E19 atoms/$cm^3$. In at least one embodiment, the first dopant concentration is constant in the first layer 234. In other embodiment, the first dopant concentration is gradient in the first layer 234, in which the first dopant concentration is increasing from the bottom portion of first layer 234 to the top portion of first layer 234 as the arrow indicated in FIG. 5.

The silicon-containing layer may further comprise an additional element, such as germanium (Ge) or carbon (C). In some embodiments, the first layer 234 is SiGe for PFET devices. In some embodiments, the first layer 234 is SiC for NFET devices. In the present embodiment, the first layer 234 also functions as a buffer layer with a limited amount of the additional element to prevent significant defects formed in an interface between the first layer 234 and the substrate 210, therefore to reduce strain relaxation or current leakage. In some embodiments, an atomic ratio (at %) of Ge in the first layer 234 for a PFET device is equal to or less than about 30 at %.

In some embodiments, the first layer 234 is SiGe with phosphorous (P) dopant for a PFET device. The SiGe layer is deposited by an epi process using a Si-containing gas, e.g., silane, dichlorosilane (DCS); a Ge-containing gas, e.g., $GeH_4$, $GeCl_4$; a carrier gas, e.g., $H_2$; a P-containing gas, e.g., $PH_3$; and/or a selective etching gas, e.g., HCl. In at least one embodiment, a mass flow of the Si-containing gas is ranging between about 50 sccm and about 300 sccm. In at least one embodiment, a mass flow of the P-containing gas is ranging between about 10 sccm and about 200 sccm. In some other embodiment, the epi process for forming the first layer 234 may be performed under a temperature ranging from about 500° C. to about 850° C., and under a pressure ranging from about 5 Torr to about 200 Torr.

In some embodiments, the first layer 234 is Si with boron (B) dopant for a NFET device. The Si layer is deposited by an epi process using a Si-containing gas, e.g., silane, DCS; a carrier gas, e.g., $H_2$; a B-containing gas, e.g., $B_2H_6$; and/or a selective etching gas, e.g., HCl. In at least one embodiment, a mass flow of the Si-containing gas is ranging between about 50 sccm and about 500 sccm. In at least one embodiment, a mass flow of the B-containing gas is ranging between about 50 sccm and about 500 sccm. In some other embodiment, the epi process for forming the first layer 234 may be performed under a temperature ranging from about 600° C. to about 900° C., and under a pressure ranging from about 10 Torr to about 500 Torr.

Figure 6A:
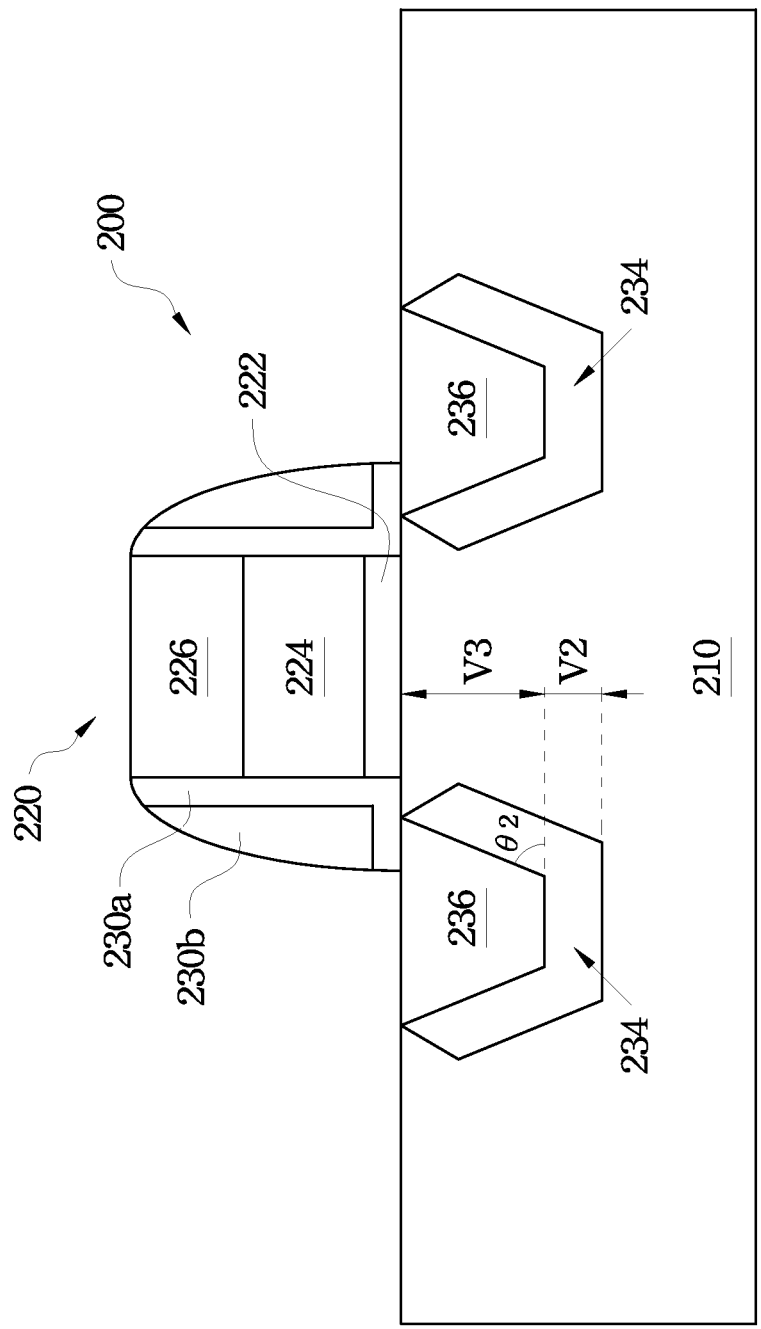
Figure 6B:
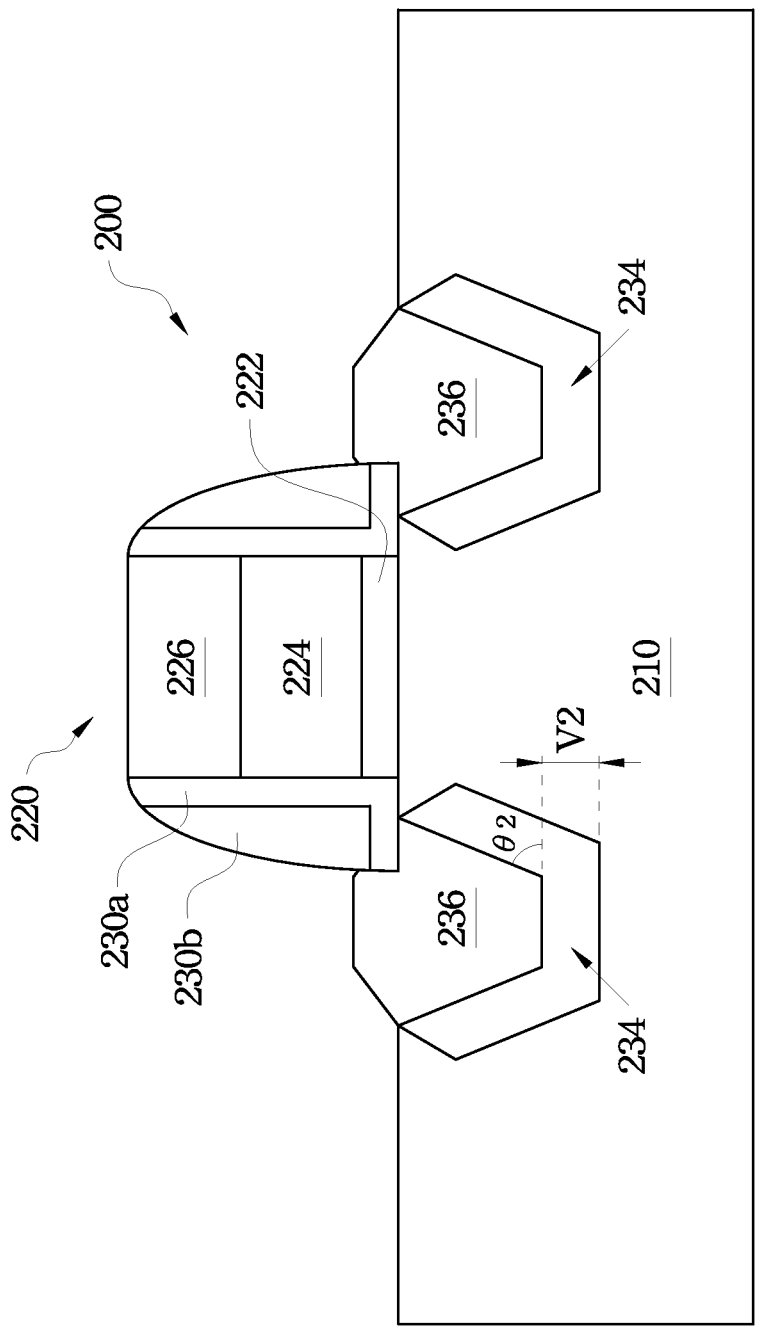

Referring to FIGS. 1, 6A, and 6B, the method 100 continues with step 110 in which a second layer 236 is formed, such that the first layer 234 is positioned between the second layer 236 and the channel region under the gate structure 220. In some embodiments, the second layer 236 is over the first layer 234 to fill the trenches 232. In some embodiments, the sidewalls and bottom portion of second layer 236 is surrounded by the first layer 234. In some embodiments, the second layer 236 is an epitaxial layer grew by an epitaxy or epitaxial process. The second layer 236 may function as a strain layer to strain or stress the channel region underneath the gate structure 220 and enhance carrier mobility of the device 200 to improve device performance.

The second layer 236 has a thickness V3. In at least one embodiment, a ratio of the thickness V3 over the thickness V2 is ranging from about 1 to about 4. In some other embodiment, the thickness V3 is ranging from about 200 Angstroms to about 600 Angstroms. In at least one embodiment, the second layer 236 has a top surface substantially co-planer with the top surface of the substrate 210 as shown in FIG. 6A. In another embodiment, the second layer 236 has a top surface higher than the top surface of the substrate 210 as shown in FIG. 6B, and the difference between the top surface of the second layer 236 and the top surface of the substrate 210 is less than about 200 Angstroms.

In some embodiments, the second layer 236 is a silicon-containing layer. The silicon-containing layer may further comprise one additional element. The additional element, for example, is germanium (Ge) or carbon (C). In some embodiments, the second layer 236 is SiGe for PFET devices. In some embodiments, the second layer 236 is SiC for NFET devices. In at least one embodiment, the second layer 236 comprises the additional element same as the additional element in the first layer 234. In some embodiments, an atomic ratio (at %) of the additional element in the second layer 236 is greater than the atomic ratio (at %) of the additional element in the first layer 234, therefore, to provide sufficient stress/strain to the semiconductor device 200. In at least one embodiment, the additional element is Ge and the second layer 236 is SiGe for a PFET device, wherein the atomic ratio of Ge in the second layer 236 is equal to or greater than about 30 at % to function as a strainer to enhance carrier mobility and improve device performance.

The second layer 236 may also function as source and drain features. In some embodiments, the second layer 236 comprises a second dopant with a second dopant concentration. In at least one embodiment, the second dopant is an n-type dopant (such as phosphorous and/or arsenic) for NFET devices. In at least another embodiment, the second dopant is a p-type dopant (such as boron and/or $BF_2$) for PFET devices. In some embodiments, the second dopant has an electrical carrier type opposite to the first dopant in the first layer 234. In some embodiments, the second layer 236 is in-situ doped during the epi process for formation of the second layer 236. In at least one embodiment, the second dopant concentration is higher than the first dopant concentration in the first layer 234. In some other embodiment, the second dopant concentration is ranging from about 5E19 atoms/cm$^3$ to about 5E21 atoms/cm$^3$. In some embodiments, the second dopant concentration is constant in the second layer 236. In some alternative embodiments, the second dopant concentration may be gradient in the second layer 236, increasing from the bottom portion to the top portion in second layer 236.

In some alternative embodiments, the second layer 236 may be an undoped layer after the performance of the epi process, and is doped in a subsequent process. The doping may be achieved by an ion implantation process, plasma immersion ion implantation (PIII) process, gas and/or solid source diffusion process, other suitable process, or combinations thereof. The second layer 236 may further be exposed to annealing processes, such as a rapid thermal annealing process.

In some embodiments, the second layer 236 is SiGe with phosphorous (P) dopant for a PFET device. The SiGe layer is deposited by an epi process using a Si-containing gas, e.g., silane, DCS; a Ge-containing gas, e.g., $GeH_4$, $GeCl_4$; a carrier gas, e.g., $H_2$; a P-containing gas, e.g., $PH_3$; and/or a selective etching gas, e.g., HCl. In at least one embodiment, a mass flow of the Si-containing gas is ranging between about 50 sccm and about 300 sccm. In at least one embodiment, a mass flow of the P-containing gas is ranging between about 10 sccm and about 200 sccm. In some other embodiment, the epi process for forming the second layer 236 may be performed under a temperature ranging from about 500° C. to about 850° C., and under a pressure ranging from about 5 Torr to about 200 Torr.

In some embodiments, the second layer 236 is Si with phosphorous (B) dopant for a NFET device. The Si layer is deposited by an epi process using a Si-containing gas, e.g., silane, DCS; a carrier gas, e.g., $H_2$; a B-containing gas, e.g., $B_2H_6$; and/or a selective etching gas, e.g., HCl. In at least one embodiment, a mass flow of the Si-containing gas is ranging between about 50 sccm and about 500 sccm. In at least one embodiment, a mass flow of the B-containing gas is ranging between about 50 sccm and about 500 sccm. In some other embodiment, the epi process for forming the second layer 236 may be performed under a temperature ranging from about 600° C. to about 900° C., and under a pressure ranging from about 10 Torr to about 500 Torr.

Figure 7:
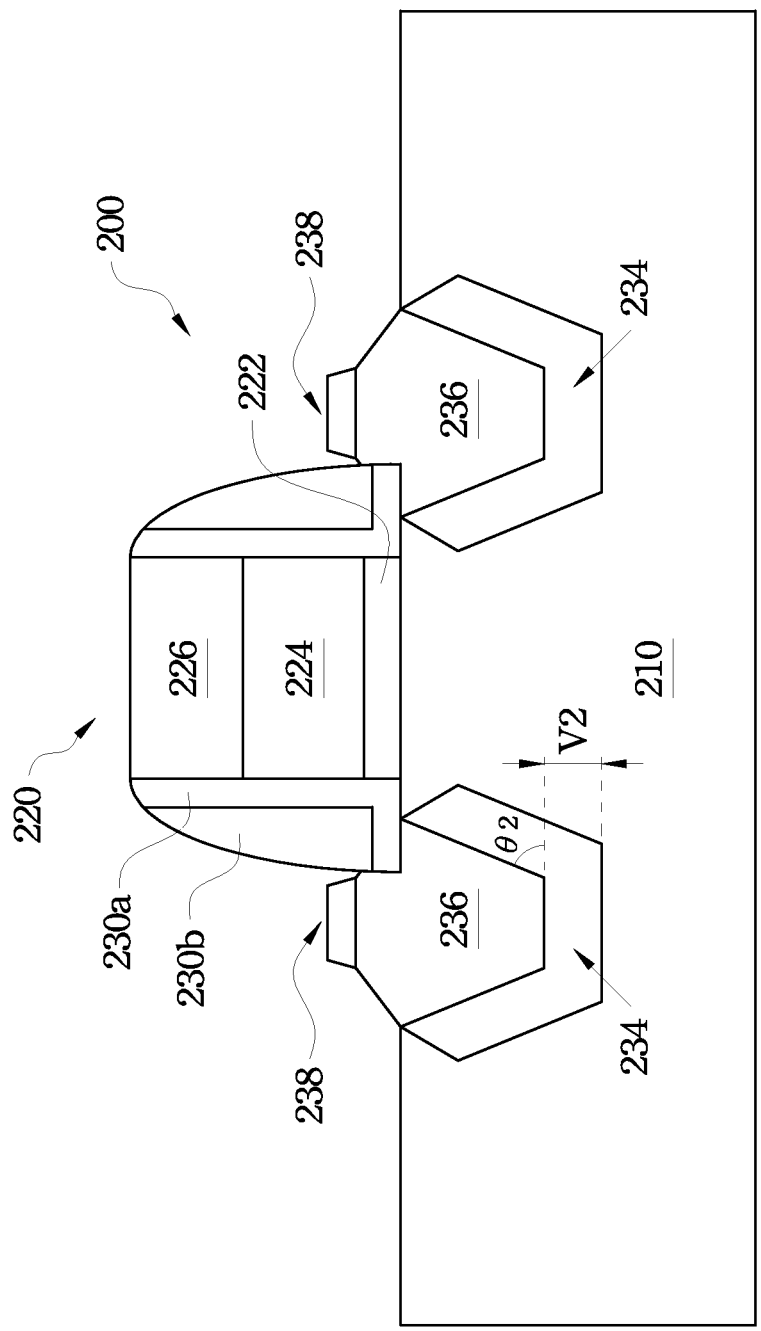

Referring to FIGS. 1 and 7, the method 100 continues with step 112 in which contact features 238 are selectively formed over the second layer 236 and contact the top surface of second layer 236. The contact features 238 may provide a low contact resistance between the second layer 236 and a silicide layer formed subsequently. In at least one embodiment, the contact features 238 have a thickness ranging from about 80 Angstroms to about 200 Angstroms.

In some embodiments, the contact features 238 comprise silicon and at least one additional element. In at least one embodiment, the contact features 238 comprise silicon and germanium for PFET devices. In another embodiment, the contact features 238 comprise silicon and carbon for NFET devices. In at least one embodiment, the contact features 238 comprise silicon and at least one additional element same as the additional element in the first layer 234. In some embodiments, an atomic ratio (at %) of the additional element in the contact features 238 is less than the atomic ratio (at %) of the additional element in the second layer 236. In at least one embodiment, the additional element is Ge and the contact features 238 are SiGe for PFET devices. In another embodiment, the atomic ratio of Ge in the contact features 238 is less than about 20 at %. In some embodiments, the contact features 238 are formed by an epi process using the same chemicals as mentioned above.

Further, the epi process may be performed under a temperature ranging from about 500° C. to about 800° C., and under a pressure ranging from about 10 Torr to about 100 Torr. The contact features 238 may be undoped or in-situ doped with dopants the same as to the second layer 236. The contact features 238 may have a dopant concentration ranging from about 1E20 atoms/cm$^3$ to about 3E21 atoms/cm$^3$. The contact features 238 may further be exposed to annealing processes, such as a rapid thermal annealing process.

The semiconductor 200 is further processed to complete fabrication as discussed briefly below. For example, silicide features are formed on the contact features to reduce the contact resistance. The silicide features may be formed over the source and drain regions by a process including depositing a metal layer, annealing the metal layer such that the metal layer is able to react with silicon to form silicide, and then removing the non-reacted metal layer.

An inter-level dielectric (ILD) layer is formed on the substrate and a chemical mechanical polishing (CMP) process is further applied to the resulting structure to planarize the substrate with the ILD. Further, a contact etch stop layer (CESL) may be formed on top of the gate structure before forming the ILD layer. In at least one embodiment, the gate electrode remains to be polysilicon in the final device. In another embodiment, the polysilicon is removed and replaced with a metal in a gate last or gate replacement process. In a gate last process, the CMP process on the ILD layer is continued to expose the polysilicon gate electrode of the gate structures, and an etching process is performed to remove the polysilicon gate electrode, thereby forming trenches. The trenches are filled with a proper work function metal (e.g., p-type work function metal and n-type work function metal) for the PFET devices and the NFET devices.

A multilayer interconnection (MLI) including metal layers and inter-metal dielectric (IMD) is formed over the substrate to electrically connect various features or structures of the semiconductor device. The multilayer interconnection includes vertical interconnects, such as vias or contacts, and horizontal interconnects, such as metal lines. The various interconnection features may utilize various conductive materials including copper, tungsten, and/or silicide. In one example, a damascene process is used to form copper multilayer interconnection structure.

The disclosed method provides a processing for forming an improved halo (pocket) features in the semiconductor device. Semiconductor device without performing an ion implantation process for forming the halo (pocket) features can prevent the damage to the device, improve short channel effect, improve uniformity of the dopant distribution in the halo (pocket) features, and therefore enhance the device performance. Further, halo (pocket) features formed by epi layer may provide additional channel strain to increase carrier mobility and further enhance the device performance. In addition, halo (pocket) features formed by epi layer may provide a precisely controlled depth of shallow junction with abrupt sidewalls. It has been observed that the disclosed methods and integrated circuit devices result in improved device performance, including but not limited to, improved control over short channel effects, increased saturation current, improved control of metallurgical gate length, increased carrier mobility, and decreased contact resistance between the source/drain and silicide features. It is understood that different embodiments may have different advantages, and that no particular advantage is necessarily required of any embodiment.

In accordance with at least one embodiment, a method includes forming a gate structure over a semiconductor substrate. The gate structure defines a channel region in the semiconductor substrate. Trenches are formed in the semiconductor substrate, and the trenches are interposed by the channel region. A first semiconductor layer is epitaxially grown in the trenches, and the first semiconductor layer has a first dopant with a first dopant concentration. A second semiconductor layer is epitaxially grown over the first semiconductor layer, and the second semiconductor layer has a second dopant with a second dopant concentration. The second dopant has an electrical carrier type opposite to an electrical carrier type of the first dopant.

In accordance with another embodiment, a method includes forming a trench in a semiconductor substrate. The trench is adjacent to a channel region. A first structure is formed in the trench, and the first structure is in contact with a bottom surface and sidewalls of the trench. The first structure has a first dopant with a first dopant concentration. A second structure is formed over the first structure and at least partially in the trench, and the second structure has a second dopant with a second dopant concentration. The second dopant has an electrical carrier type opposite to an electrical carrier type of the first dopant.

In accordance with another embodiment, a method includes forming a gate structure over a substrate, and the gate structure defining a channel region in the substrate. Two trenches are formed in the substrate, and the two trenches are interposed by the channel region. Sidewalls and bottom portions of the two trenches are along one or more {111} facets of the substrate. A first structure is epitaxially grown in the trenches, and the first structure extends along the sidewalls and the bottom portions of the two trenches. The first structure has a first dopant with a first dopant concentration. A second structure is epitaxially grown over the first structure, and the second structure has a second dopant with a second dopant concentration. The second dopant has an electrical carrier type opposite to an electrical carrier type of the first dopant.

The foregoing outlines features of several embodiments so that those skilled in the art may better understand the aspects of the present disclosure. Those skilled in the art would appreciate that they may readily use the present disclosure as a basis for designing or modifying other processes and structures for carrying out the same purposes and/or achieving the same advantages of the embodiments introduced herein. Those skilled in the art would also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a gate structure over a semiconductor substrate, the gate structure defining a channel region in the semiconductor substrate;
   forming trenches in the semiconductor substrate, interposed by the channel region;
   epitaxially growing a first semiconductor layer in the trenches, the first semiconductor layer having a first dopant with a first dopant concentration; and
   epitaxially growing a second semiconductor layer over the first semiconductor layer, the second semiconductor layer having a second dopant with a second dopant concentration, wherein the second dopant has an electrical carrier type opposite to an electrical carrier type of the first dopant.

2. The method of claim 1, further comprising:
   forming spacers adjoining opposite sidewalls of the gate structure.

3. The method of claim 1, wherein the first dopant concentration ranges from about 1E18 atoms/cm$^3$ to about 5E19 atoms/cm$^3$.

4. The method of claim 1, wherein the second dopant concentration ranges from about 5E19 atoms/cm$^3$ to about 5E21 atoms/cm$^3$.

5. The method of claim 1, wherein the epitaxially growing the first semiconductor layer is performed by epitaxially growing SiGe, and the first dopant is phosphorous or arsenic.

6. The method of claim 1, wherein the epitaxially growing the second semiconductor layer is performed by epitaxially growing SiGe, and the second dopant is boron or BF$_2$.

7. The method of claim 1, wherein the epitaxially growing the first semiconductor layer is performed by epitaxially growing Si or SiC, and the first dopant is boron or BF$_2$.

8. The method of claim 1, wherein the epitaxially growing the second semiconductor layer is performed by epitaxially growing Si or SiC, and the second dopant is phosphorous or arsenic.

9. The method of claim 1, wherein the second dopant concentration is set to be higher than the first dopant concentration.

10. A method comprising:
   forming a trench in a semiconductor substrate, the trench being adjacent to a channel region;
   forming a first structure in the trench, the first structure being in contact with a bottom surface and sidewalls of the trench, and the first structure having a first dopant with a first dopant concentration; and
   forming a second structure over the first structure and at least partially in the trench, the second structure having a second dopant with a second dopant concentration, and the second dopant having an electrical carrier type opposite to an electrical carrier type of the first dopant.

11. The method of claim 10, wherein the first dopant concentration ranges from about 1E18 atoms/cm$^3$ to about 5E19 atoms/cm$^3$.

12. The method of claim 10, wherein the second dopant concentration ranges from about 5E19 atoms/cm$^3$ to about 5E21 atoms/cm$^3$.

13. The method of claim 10, wherein the forming the first structure is performed by epitaxially growing SiGe, and the first dopant is phosphorous or arsenic.

14. The method of claim 10, wherein the forming the second structure is performed by epitaxially growing SiGe, and the second dopant is boron or BF$_2$.

15. The method of claim 10, wherein the forming the first structure is performed by epitaxially growing Si or SiC, and the first dopant is boron or BF$_2$.

16. The method of claim 10, wherein the forming the second structure is performed by epitaxially growing Si or SiC, and the second dopant is phosphorous or arsenic.

17. The method of claim 10, wherein the second dopant concentration is set to be higher than the first dopant concentration.

18. A method comprising:
   forming a gate structure over a substrate, the gate structure defining a channel region in the substrate;
   forming two trenches in the substrate, the two trenches being interposed by the channel region, and sidewalls and the bottom portions of the two trenches being along one or more {111} facets of the substrate;
   epitaxially growing a first structure in the trenches, the first structure extending along the sidewalls and bottom portions of the two trenches, and the first structure having a first dopant with a first dopant concentration; and
   epitaxially growing a second structure over the first structure, the second structure having a second dopant with a second dopant concentration, the second dopant having an electrical carrier type opposite to an electrical carrier type of the first dopant.

19. The method of claim 18, wherein the first dopant concentration ranges from about 1E18 atoms/cm$^3$ to about 5E19 atoms/cm$^3$.

20. The method of claim 18, wherein the second dopant concentration ranges from about 5E19 atoms/cm$^3$ to about 5E21 atoms/cm$^3$.

* * * * *